United States Patent [19]

Iwase et al.

[11] Patent Number: 5,172,337
[45] Date of Patent: Dec. 15, 1992

[54] SEMICONDUCTOR MEMORY DEVICE

[75] Inventors: Taira Iwase; Yasuo Naruke, both of Kawasaki, Japan

[73] Assignee: Kabushiki Kaisha Toshiba, Kawasaki, Japan

[21] Appl. No.: 778,064

[22] PCT Filed: Apr. 6, 1991

[86] PCT No.: PCT/JP91/00459

§ 371 Date: Dec. 6, 1991

§ 102(e) Date: Dec. 6, 1991

[30] Foreign Application Priority Data

Apr. 6, 1990 [JP] Japan .................................. 2-91419

[51] Int. Cl.$^5$ ............................................. G11C 17/00
[52] U.S. Cl. ...................................... 365/96; 365/208;
307/443; 307/542; 307/564; 307/202.1
[58] Field of Search ....................... 365/96, 225.7, 207,
365/208; 307/542, 443, 564, 565, 566, 451,
202.1

[56] References Cited

U.S. PATENT DOCUMENTS 5,065,048 11/1991 Asai et al. ............................ 307/443
5,111,075 5/1992 Ferry et al. .......................... 307/451

FOREIGN PATENT DOCUMENTS 2-54500 2/1990 Japan .

Primary Examiner—Joseph E. Clawson, Jr.
Attorney, Agent, or Firm—Foley & Lardner

[57] ABSTRACT

A semiconductor memory device of the present invention is a semiconductor memory device formed on a semiconductor layer (30) of a first conductivity type and having a plurality of fuse melting type non-volatile memory cells (1) disposed generally in a matrix form, wherein the memory cell (1) has a read transistor (3), a current-melting fuse (7), and a fuse blow transistor (5), one end of the read transistor (3) is connected to a read data line (13), the other end thereof is connected via the current-melting fuse (7) to a write data line (17), an interconnection (C$_1$) between the read transistor (3) and the fuse (7) is connected via the fuse blow transistor (5) to ground by a ground wiring (15), the write data lines (17) and the ground wirings (15) of the memory cells (1) disposed in a row direction are connected in common, and a noise absorbing element (21) is connected between the write data line (17) and the ground wiring (15), the noise absorbing element (21) suppressing a potential difference between the write data line (17) and the ground wiring (15) from becoming large.

17 Claims, 7 Drawing Sheets

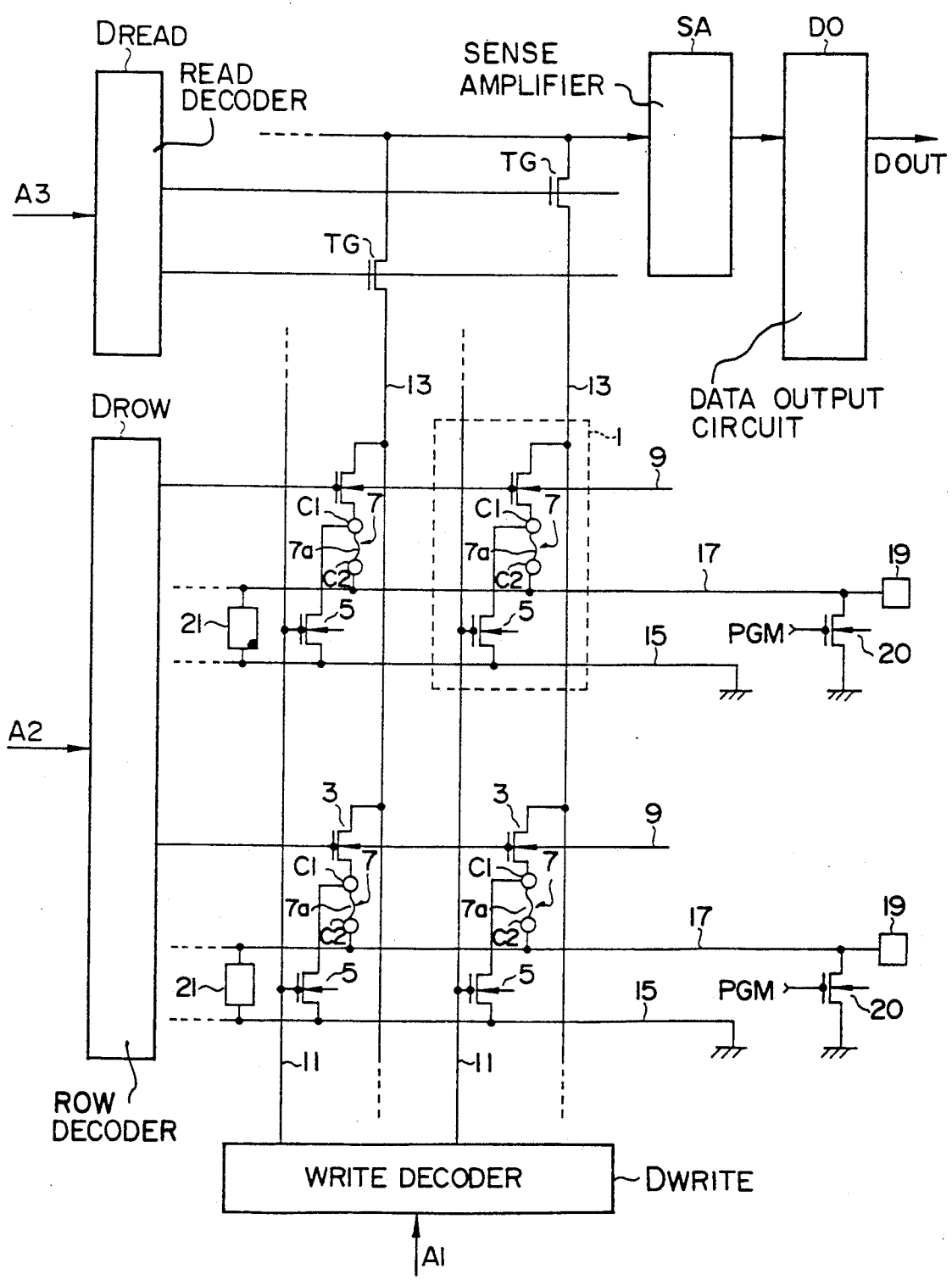
F I G. 5

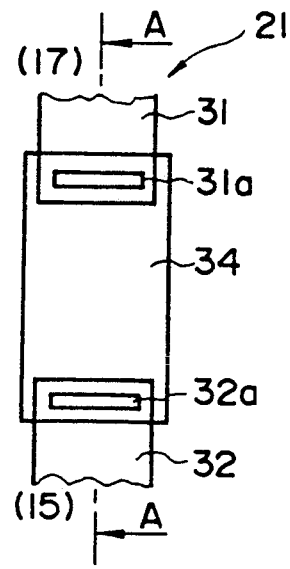
F I G. 6
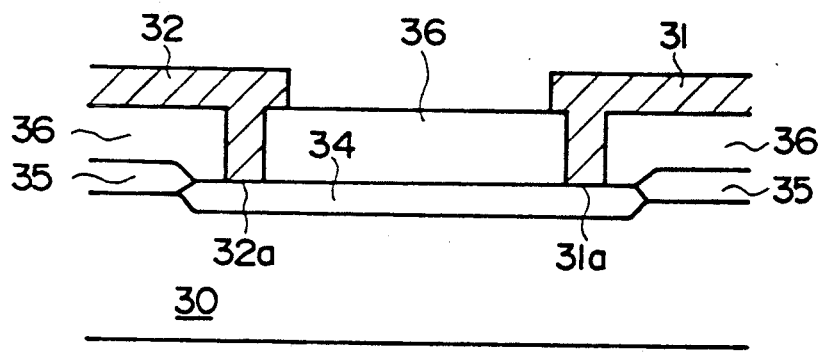
F I G. 7
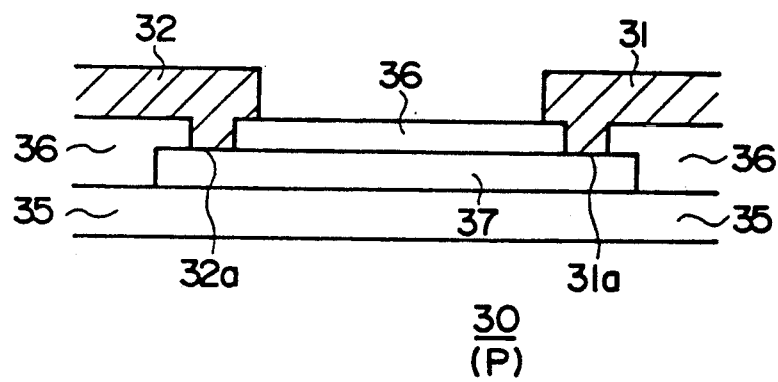
F I G. 8

SEMICONDUCTOR MEMORY DEVICE

FIELD OF THE INVENTION

The present invention relates to a semiconductor memory, and more particularly to a non-volatile semiconductor memory device of a fuse melting type.

BACKGROUND OF THE INVENTION

FIG. 1 shows a part of a fuse melting type non-volatile memory device proposed in Japanese Patent Application (Patent Application No. 63-204802) filed by the present inventor.

In FIG. 1, a memory cell 12 has a read-only N-channel MOS transistor (hereinafter called N-MOS) 3, an N-MOS 5 for melting a fuse, and a fuse 7 to be melted with current. Such memory cells 1 are formed on a chip and disposed in a matrix shape.

Each N-MOS 3 is formed as having, for example, a channel width 2 μm, a channel length 2 μm, a gate electrode film thickness 4000 Å, and a gate oxide film thickness 200 Å. The gate terminal of the N-MOS 3 is connected to a read word line 9. The N-MOS 3 becomes conductive when data is read.

Each N-MOS 5 is formed as having, for example, a channel width 7 μm, a channel length 1.0 μm, a gate electrode film thickness 4000 Å, and a gate oxide film thickness 200 Å. The gate terminal of the N-MOS 5 is connected to write word line 11. The N-MOS 5 becomes conductive when data is written.

As the characteristics of the N-MOS 5, the relation between a drain voltage $V_D$ and a drain current $I_D$ is shown in FIG. 2. Referring to FIG. 2, the N-MOS 5 causes a secondary breakdown at a drain voltage about 7 V while a power source voltage (about 5 V) is applied as a gate voltage $V_G$. Namely, a snap back operation is performed. Under such a condition, the N-MOS 5 can flow a large current in the order of 80 mA. As seen from FIG. 2, the N-MOS 5 has a drain breakdown voltage of about 15 V when the gate terminal is set to the ground potential.

A serial connection of the N-MOS 3 and N-MOS 5 is serially connected between a read data line 13 and a ground wiring 15 connected to ground. The interconnection point $C_1$ between these transistors 3 and 5 is connected to one end of the fuse 7 whose other end is connected to a write data line 17.

The fuse 7 is made of polysilicon having a thickness 4000 Å same as that of the gate electrodes of the transistors 3 and 5. A narrow melting portion 7a at the center of the fuse 7 has a width 0.8 μm and a length 2 μm. The interconnection point $C_1$ and a contact area $C_2$ of the write data line (on the high voltage side of power source lines) 17 each are formed 2 μm×2 μm. Thus, the size of the memory cell 1 is about 140 μm² (20 μ×7 μ) which is a considerably small occupying area.

The write data line 17 to which the other end of the fuse 7 is connected, is connected at its one end to a pad 19. Power is externally supplied via this pad 19 to melt the fuse 7. Namely, a voltage applied to the pad 19 (hereinafter called a melting voltage) is set such that only the N-MOS 5 connected to the fuse 7 to be melted takes the secondary breakdown state. Consider now the case where the fuse 7 (1) of a memory cell 1 (1) is to be melted. In this case, a word line 11 (1) is set to the power source voltage, and a word line 11 (2) is set to the ground potential. As a result, an N-MOS (1) turns on and an N-MOS (2) turns off. Under this condition, a melting voltage is applied to a pad 19 (I). This melting voltage is set to a value lower than the drain breakdown voltage of the N-MOS 5 (2), and higher than the secondary breakdown voltage of the N-MOS 5. Therefore, current flows only through the fuse 7 (1) and not through a fuse 7 (2), melting the fuse 7 (1) as will be described later more in detail.

An N-MOS 20 is connected between the write data line 17 and ground, the N-MOS 20 being turned on and off by a program signal $\overline{PGM}$. This N-MOS 20 is made non-conductive by a low level program signal when data is written. On the other hand, when data is read, the N-MOS 20 is made conductive by a high level program signal to set the write data line to the ground potential.

The write data line 17 and the ground wiring (on the low voltage side of power source lines) 15 are made of metal. The read data line 13 is made of polysilicon, n- or p-type diffusion layer, high temperature melting point metal silicide, metal of two-layered structure different from the metal of the write data line 17 and wiring 15, or a combination thereof.

Next, the data read/write operation of the memory cell 1 constructed as above will be described.

First, in operation of data write, i.e., in melting the fuse 7 (1), the program signal $\overline{PGM}$ takes a low level to make an N-MOS 20 (I) non-conductive. The pad 19 (I) is applied with the melting voltage. Next/ the power source voltage (about 5 V) is applied to the work line 11 (1).

As a result, the N-MOS 5 (1) takes the secondary breakdown state. Thus, a large current flows through a path from the pad 19 (I) write data line 17 (I) fuse 7 (1) to be melted N-MOS 5 (1) ground wiring 15 (I), and to ground. The fuse 7 (1) is therefore melted down. Then, the serial interconnection point $C_1$ of the selected memory cell 1 (1) is disconnected from the write data line 17 (I) and a write operation is carried out.

Next, the read operation for the memory cells 1 (1) and 1 (2) will be described.

First, the program signal $\overline{PGM}$ is set to the high level state to make the N-MOS 20 (I) conductive. The read word line 9 (I) is set to the high level state to make the N-MOS 3 (1) conductive. Since the fuse 7 (2) of the memory cell 1 (2) is not melted, a read data line 13 (ii) is grounded via the N-MOS 3 (2), fuse 7 (2), and NMOS 20 (I) to take the low level state. In this state, a low level data is read from the selected memory cell 1 (2).

On the other hand, since the fuse 7 (1) of the memory cell 1 (1) was melted, a read data line 13 (i) maintains to hold the high level state before the read operation. Thus, a high level data is read from the selected memory cell 1 (1).

As described above, in the memory cell 1 shown in FIG. 1, the transistor used for melting the fuse 7 is formed in a MOS type and this transistor is caused to take the secondary breakdown state when the fuse 7 is melted. Therefore, a large current can be obtained with a small channel width. Thus, the transistor used for melting a fuse can be made compact, and the memory cell 1 having a small occupying area can be realized.

Furthermore, since the fuse 7 is melted by a large current, the time required for melting the fuse can be shortened. For example, it is possible to write data in about 0.1 second in memory cells of about 2 K bits.

Still further, in the above-described device, data is written when the electrical characteristics of memory cells are inspected. Therefore, data can be written at the same time without using an apparatus dedicated to data write.

Accordingly, such a memory cell 1 is very suitable for use as a reserved cell of a mask ROM having a redundancy structure. Therefore, by using such a memory cell as a reserved cell, a defective cell of a mask ROM can be replaced by the reserved cell in practical use.

The fuse 7 is melted in a short time by using a fuse melting current $I_f$ of several tens mA or larger. A change of the current before and after melting the fuse 7 is great. Therefore, as seen from FIG. 3, the potentials of a pair of power source lines $E_h$ and $E_l$ oscillate. Namely, noises are superposed upon the pair of power source lines. These noises change not only the potential $E_h$ at the high potential side power source line, but also the potential (ground potential) $E_l$ at the low potential side power source line. Because of such potential change, the voltage $V_E$ becomes large such as to $V_{ET1}$, so it is not rare that the circuit operates erroneously. If a MOS transistor is used particularly for the fuse blow transistor 5, the above described oscillation causes the voltage $E_h$ of the write data line 19 on the high voltage side to become higher than the drain breakdown voltage of the transistor 5, or conversely, causes the voltage $E_l$ of the ground wiring 15 on the low voltage side to become lower than the threshold value of the gate of the transistor 5, resulting in a malfunction of turning on the transistor 5. Therefore, the fuse 7 connected to the transistor 5 is melted so that an erroneous data is written. The above-described phenomenon occurs within the chip. From this reason, it is very difficult to deal with such a phenomenon using an external circuit of the chip.

SUMMARY OF THE INVENTION

The present invention has been made in view of the above-described circumstances, and aims at providing a semiconductor memory device capable of suppressing as small as possible a change of the power source potentials on the high and low voltage sides caused upon melting a current-melting fuse, and preventing an erroneous data write.

A semiconductor memory device of the present invention is a semiconductor memory device formed on a semiconductor layer of a first conductivity type and having a plurality of fuse melting type non-volatile memory cells disposed generally in a matrix form, wherein the memory cell has a read transistor, a current-melting fuse, and a fuse blow transistor, one end of the read transistor is connected to a read data line, the other end thereof is connected via the current-melting fuse to a write data line, an interconnection between the read transistor and the fuse is connected via the fuse blow transistor to ground by a ground wiring, the write data lines and the ground wirings of the memory cells disposed in a row direction are connected in common, and a noise absorbing element is connected between the write data line and the ground wiring, the noise absorbing element suppressing a potential difference between the write data line and the ground wiring from becoming large.

BRIEF DESCRIPTION OF THE DRAWINGS

FIG. 5 is a circuit diagram showing the main part of the embodiment of the present invention, FIGS. 6, 9, 12, and 14 are diagrams showing different examples of a noise absorbing element, FIG. 7 is a cross section taken along line A—A of FIG. 6, FIG. 8 is a cross section showing a modification of the structure shown in FIG. 7, FIGS. 10 and 11 are cross sections taken along lines A—A and B—B respectively of FIG. 9.

DESCRIPTION OF THE PREFERRED EMBODIMENTS

Figure 1:
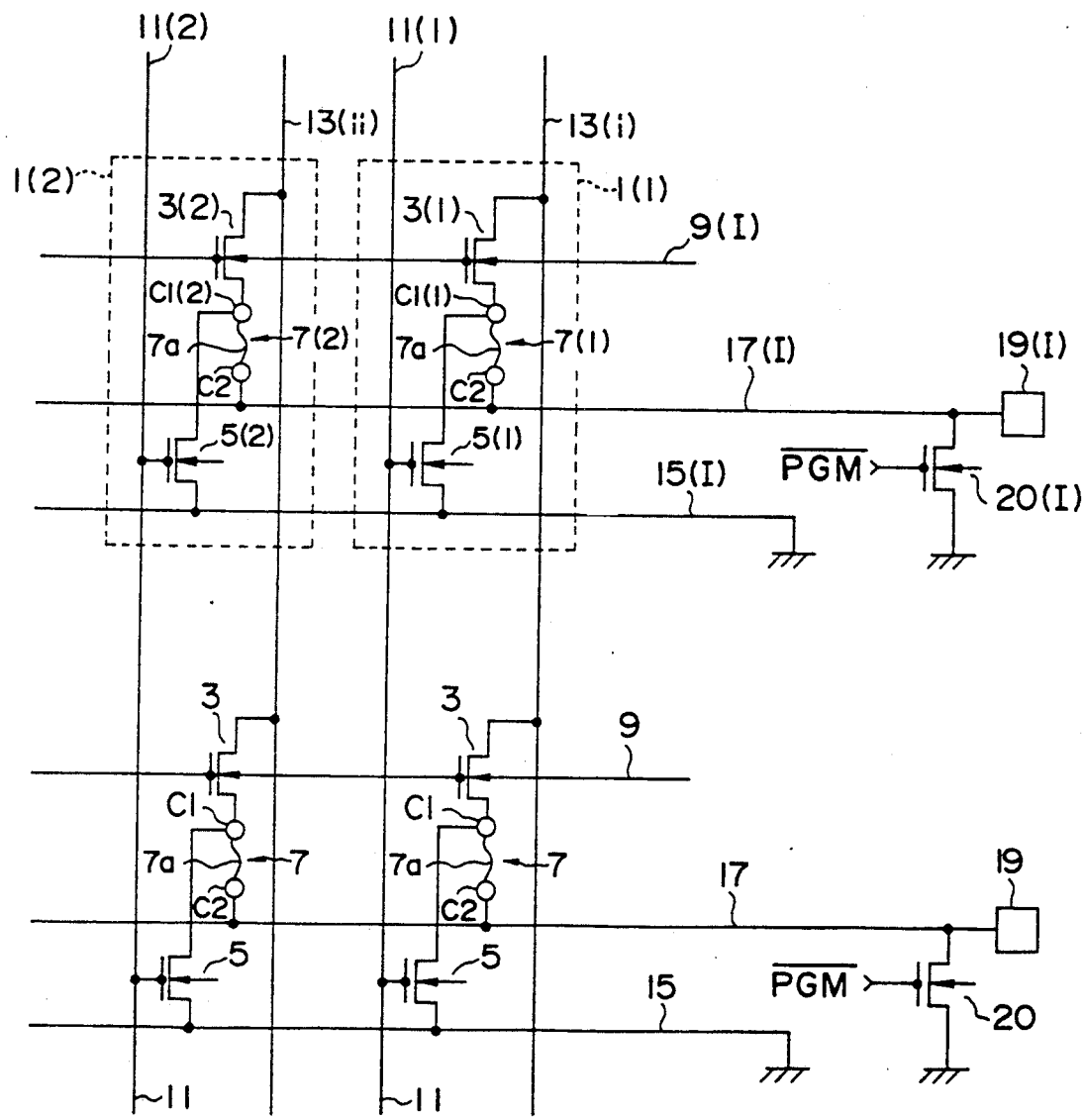
FIG. 1 is a circuit diagram illustrating the background art.
Figure 2:
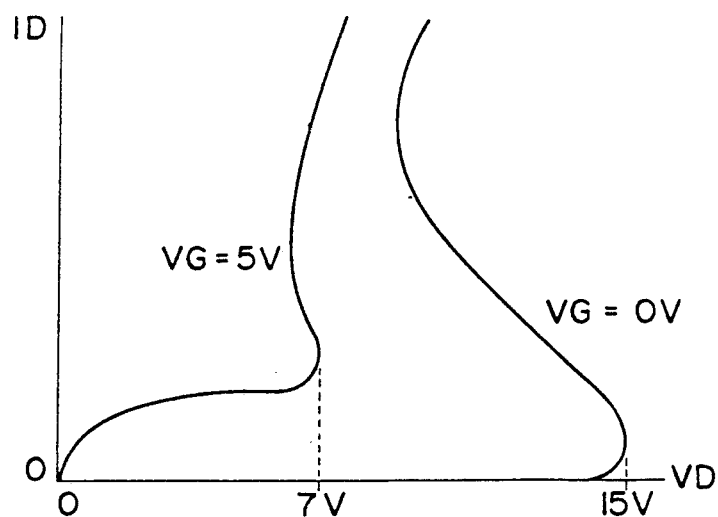
FIG. 2 is a graph showing the characteristics of a transistor for melting a fuse.
Figure 3:
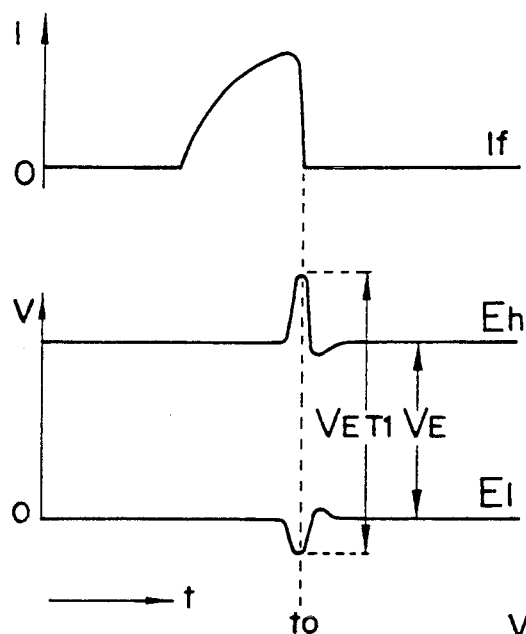
FIG. 3 shows waveforms illustrating a potential change of power source lines when a fuse is melted.
Figure 4:
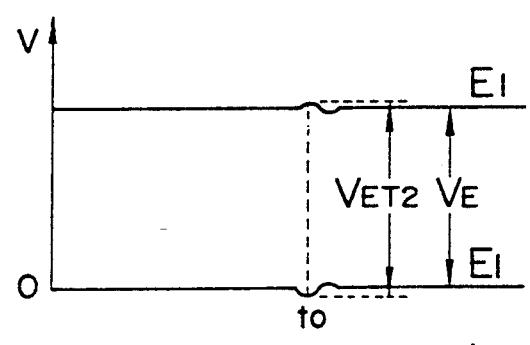
FIG. 4 shows waveforms illustrating an operation example of an embodiment of the present invention.

FIG. 5 shows a part of an embodiment of the present invention, which corresponds to FIG. 1. In FIG. 5, like elements to those shown in FIG. 1 are represented by using identical reference numerals. A difference of FIG. 5 from FIG. 1 is as follows. Namely, a noise absorbing element 21 is connected between the write data line 17 and the ground wiring 15. This element 21 prevents noises from superposing upon the power source lines 19 and 15 on the high and low voltage sides when a fuse is melted. The other structure in FIG. 5 is the same as that in FIG. 1.

Referring to FIG. 5, in writing data, a write decoder $D_{WRITE}$ decodes an address $A_1$ to select an arbitrary write work line 11. In reading data, a row decoder $D_{ROW}$ decodes an address $A_2$ to select an arbitrary read word 9. At this time, a read decoder $D_{READ}$ decodes an address $A_3$ to open an arbitrary transfer gate TG. Thus, the data is outputted as $D_{OUT}$ via a sense amplifier SA and a data output circuit DO.

Use of the element 21 can suppress to a small value a potential difference $V_{ET2}$ between a pair of power source lines when a fuse is melted at time $t_0$. Therefore, transistors for melting a fuse in non-selected cells are prevented from being turned on by a breakdown thereof or by a ground potential lowered than the threshold value $V_t$.

As the noise absorbing element 21, elements of various types may be used.

An element of a first type is constructed as a resistive element. In this case, a relatively large current is made to always flow between the two power source lines 17 and 15. As a result, a change of a value of the current flowing between the two power source lines before and after melting the fuse 7 is suppressed to a small value. For example, it is assumed that a current "100" is made to always flow through the noise absorbing element 21, and a current "30" flows through the fuse 7. Then, a total current "130" will flow through the fuse immediately before melting the fuse, and a current "100" will flow immediately after melting the fuse. In other words, a current change factor becomes 100/130. In contrast with this, if the noise absorbing element 21 is not used at all, the current change factor becomes 30/0 ($= \infty$).

An element of a second type becomes conductive when the potential difference between the power source lines 17 and 15 on the high and low voltage sides becomes equal to or larger than a predetermined value. Such conduction prevents the potential difference between the power source lines 17 and 15 from exceeding the drain breakdown voltage $V_1$, and the potential at the low voltage side power source line 15 from becoming lower than the threshold value $V_t$.

Figure 9:
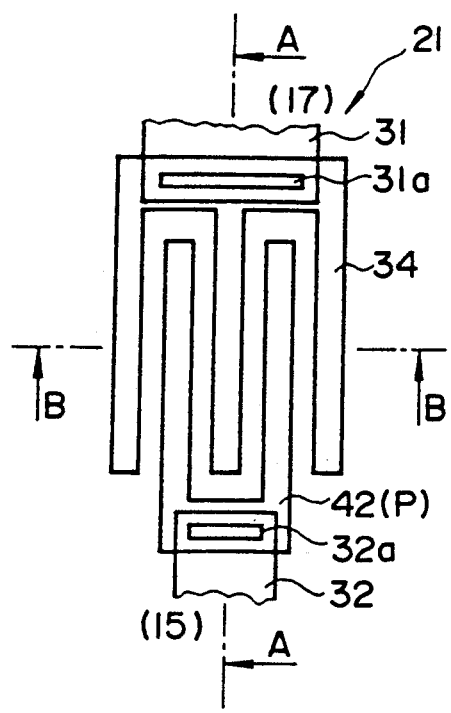
Figure 12:
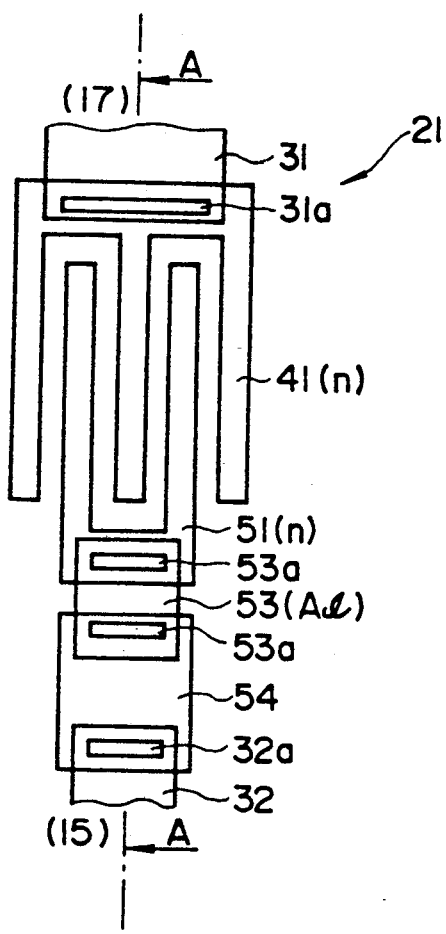
Figure 14:
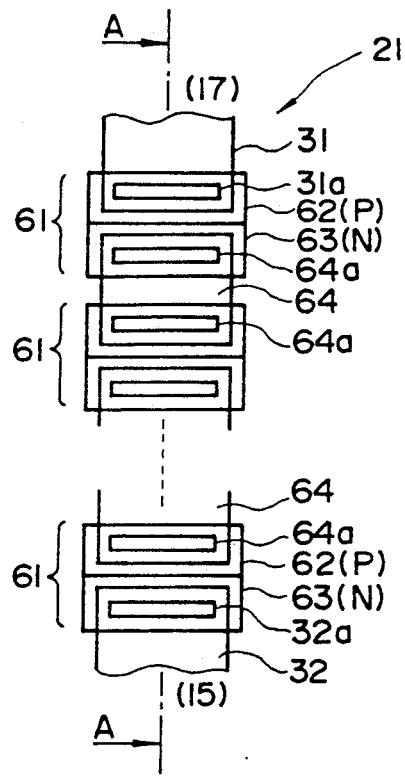

Various types of structures may apply to the noise absorbing element. Specifically, the structure of the first type element may use the structure such as shown in FIG. 6, and the structure of the second type may use the structure such as shown in FIGS. 9, 12, and 14.

FIG. 6 shows an example of the structure of the noise absorbing element 21 formed in the resistive element type. This element 21 has an Al wiring 31 connected to the high voltage side power source line 17, and another Al wiring 32 connected to the low voltage side power source line 15. These wirings 31 and 32 are connected to a diffusion layer 34, respectively via contacts 31a and 32a.

FIG. 7 is a cross section taken along line A—A of FIG. 6. As seen from FIG. 7, the element shown in FIG. 6 is configured such that on the surface of a p-type semiconductor substrate 30, an n-type diffusion layer 34 is formed with field insulating films 35 and 35 sandwiching the former, and the Al wirings 31 and 32 are made in contact with the layer 34 at its both ends using an interlayer insulating film 36.

By using this element 21, as described previously, a current flows through the element 21 so long as a voltage is applied between the power source lines, so that the voltage across the power source lines 17 and 15 can be stabilized irrespective of whether the fuse 7 is melted or not.

Instead of the diffusion layer 34, polysilicon or silicide may be used. FIG. 8 shows such an example. In this element, polysilicon (or silicide) 37 is formed on a p-type semiconductor substrate 30 with a field oxide film 35 being interposed therebetween.

FIG. 9 shows an example of a noise absorbing element 21 of the second type. In this example, an Al wiring 31 on the high voltage side is connected via a contact 31a to an n-type diffusion layer 34, and an Al wiring 32 on the low voltage side is connected via a contact 32a to a p-type high concentration diffusion layer 42 of a p-type substrate 30. The diffusion layers 34 and 42 are formed in a comb shape to allow a large current to flow.

Figure 10:
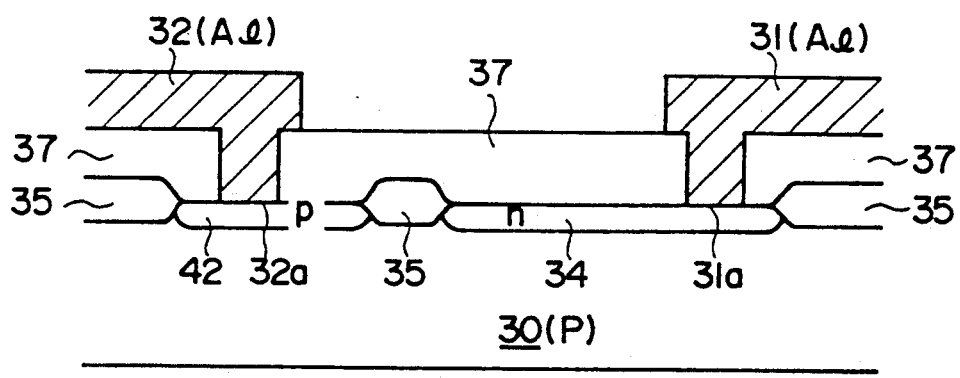
Figure 11:
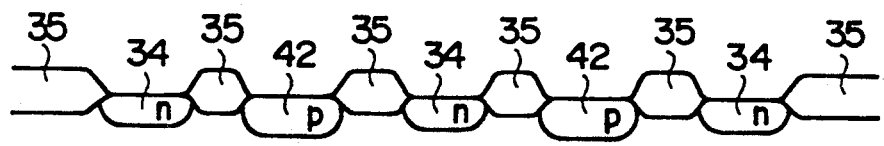

The cross sections taken along lines A—A and B—B of FIG. 9 are shown in FIGS. 10 and 11, respectively. As seen from FIGS. 10 and 11, in the element of FIG. 9, an n-type diffusion layer 34 and p-type diffusion layer 35 are formed on the surface of a p-type semiconductor substrate 30 with a field insulating film 35 being sandwiched therebetween, and Al wirings 31 and 32 are made in contact with the layers 34 and 42 with an interlayer insulating film 37 being interposed therebetween.

In the noise absorbing element 21 constructed as above, the n-type diffusion layer 34 is connected to the power source line 17 on the high voltage side. Therefore, when a voltage higher than a breakdown voltage of the junction between the diffusion layer 34 and the substrate is applied to the diffusion layer 34, a breakdown occurs to lower the voltage.

Figure 13:
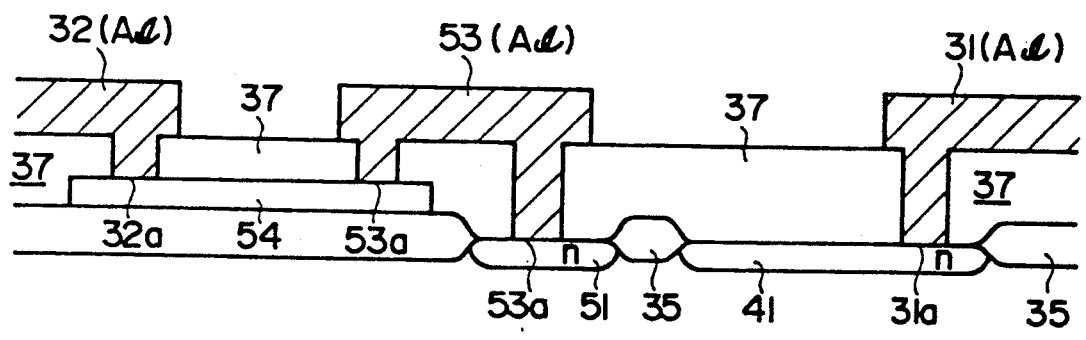
FIG. 13 is a cross section taken along line A—A of FIG. 12.

FIG. 12 shows another example of the noise absorbing element 21 of the second type A difference of the element 21 shown in FIG. 21 from the element 21 shown in FIG. 9 resides in that a diffusion layer 51 connected to the power source line 15 on the low voltage side is also made of an n type. In FIG. 12, the two diffusion layers 41 and 51 facing each other in a comb tooth shape are both of the n-type, so there is a risk of large current flow. To avoid this, in FIG. 12, a current limiting resistive member 54 is formed between an Al wiring 32 and an n-type diffusion layer 51. Specifically, a diffusion layer 54 serving as a resistive member is formed between the n-type diffusion layer 51 and the Al wiring 32. One end of the diffusion layer 54 is connected to the n-type diffusion layer 51 via a pair of contacts 53a and 53a on the Al wiring 53. The other end of the diffusion layer 54 is connected to the Al wiring 32 via a contact 32a. Instead of this diffusion layer 54, a resistive member made of polysilicon or silicide may be used. The cross section taken along line A—A of FIG. 12 is shown in FIG. 13.

Also in the noise absorbing element shown in FIG. 12, when a voltage higher than the breakdown voltage is applied across the n-type diffusion layer 41 and the substrate 30, a breakdown occurs to lower the voltage, similar to the case of the element 21 shown in FIG. 9.

Similar to the diffusion layer 34 of FIG. 6, the diffusion layer 54 of FIG. 12 may be made of polysilicon or silicide such as shown in FIG. 8.

Figure 15:
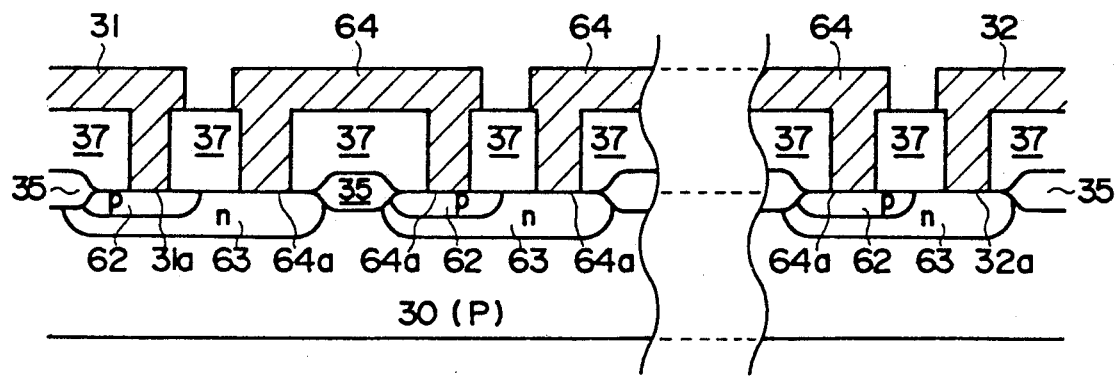
FIG. 15 is a cross section taken along line A—A of FIG. 14.

FIG. 14 shows another example of the noise absorbing element 21 of the second type. In this example, a plurality of diodes 61, 61, . . . are serially connected in the forward direction between an Al wiring 31 connected to the high voltage side power source line 17 and an Al wiring 32 connected to the low voltage side power source line 15. Specifically, each diode 61 is constructed of a p-type diffusion layer 62 and an n-type diffusion layer 63 both contacting each other. As the diode 61, a metal-semiconductor junction diode may be used. In the adjacent diodes 61, the n-type diffusion layer 63 of one diode is connected to the p-type diffusion layer 62 of the other diode via contacts 64a and 64a of an Al wiring 64. The p-type diffusion layer 62 of the diode 61 located most upstream is connected to an Al wiring 31, and the n-type diffusion layer 63 of the diode located most downstream is connected to an Al wiring 32. The cross section taken along line VA—VA of FIG. 14 is shown in FIG. 15.

In the noise absorbing element 21 constructed as above, a voltage drop at the diodes 61, 61, . . . can stabilize the potential between a pair of power source lines. The voltage at which a current starts flowing can be changed by changing the number of diodes 31.

In the drawings used for the above description, like elements are represented by using identical reference numerals.

Instead of MOS transistors described above, other MIS transistors may also be used.

We claim:

1. A semiconductor memory device formed on a semiconductor layer (30) of a first conductivity type and having a plurality of fuse melting type non-volatile memory cells (1) disposed generally in a matrix form, wherein said memory cell (1) has a read transistor (3), a current melting fuse (7), and a fuse blow transistor (5), one end of said read transistor (3) is connected to a read data line (13), the other end thereof is connected via said current melting fuse (7) to a write data line (17), an interconnection ($C_1$) between said read transistor (3) and said fuse (7) is connected via said fuse blow transistor (5) to ground by a ground wiring (15), said write data lines (17) and said ground wirings (15) of said memory cells (1) disposed in a row direction are connected in common, and a noise absorbing element (21) is connected between said write data line (17) and said ground wiring (15), said noise absorbing element (21) suppressing a potential difference between said write data line (17) and said ground wiring (15) from becoming large.

2. A device according to claim 1, wherein said noise absorbing element (21) is a resistive element for always flowing a predetermined value current between said write data line (17) and said ground wiring (15).

3. A device according to claim 2, wherein said resistive element (21) is an impurity diffusion layer (34) of a second conductivity type formed on the surface of said semiconductor layer (30).

4. A device according to claim 2, wherein said resistive element (21) is polysilicon (37) formed on said semiconductor layer (30) with an insulating layer (35) being interposed therebetween.

5. A device according to claim 2, wherein said resistive element (21) is silicide (37) formed on the surface of said semiconductor layer (30) with an insulating layer (35) being interposed therebetween.

6. A device according to claim 1, wherein said noise absorbing element (21) comprises a second conductivity type layer (34) and a first conductivity type layer (42) spaced apart by a predetermined distance and formed on the surface of said semiconductor layer (30) of said first conductivity type, and said noise absorbing element (21) becomes conductive when the potential at said write data line (17) becomes equal to or higher than a predetermined value relative to the potential of said ground wiring (15) when said fuse (7) is melted.

7. A device according to claim 6, wherein said first and second conductivity type layers (42, 34) each are formed in a comb shape and disposed to mesh with each other, and said first and second conductivity type layers face each other with a predetermined distance therebetween.

8. A device according to claim 6, wherein said first and second conductivity type layers (42, 34) each are an impurity layer formed on the surface of said semiconductor layer (30).

9. A device according to claim 7, wherein said first and second conductivity type layers (42, 34) each are an impurity layer formed on the surface of said semiconductor layer (30).

10. A device according to claim 1, wherein said noise absorbing element (21) comprises a pair of second conductivity type layers (41, 51) spaced apart by a predetermined distance and formed on the surface of said semiconductor layer (30) of said first conductivity type, and becomes conductive when the potential at said write data line (17) becomes equal to or higher than a predetermined value relative to the potential of said ground wiring (15) when said fuse (7) is melted.

11. A device according to claim 10, wherein said pair of first and second conductivity type layers (41, 51) each are formed in a comb shape and disposed to mesh with each other, and said pair of first and second conductivity type layers (41, 51) face each other with a predetermined distance therebetween.

12. A device according to claim 10, wherein said pair of first and second conductivity type layers (41, 51) is connected serially to a current limiting resistive member (54).

13. A device according to claim 11, wherein said pair of first and second conductivity type layers (41, 51) is connected serially to a current limiting resistive member (54).

14. A device according to claim 12, wherein said resistive member (54) is an impurity diffusion layer formed on the surface of said semiconductor layer (30) with an insulating layer (35) interposed therebetween.

15. A device according to claim 13, wherein said resistive member (54) is an impurity diffusion layer formed on the surface of said semiconductor layer (30) with an insulating layer (35) being interposed therebetween.

16. A device according to claim 1, wherein said noise absorbing element (21) comprises an arbitrary number of diodes connected in a forward direction.

17. A device according to claim 14, wherein said diodes are formed such that a plurality of diode second conductivity type impurity layers (63) are formed on the surface of said first conductivity type impurity layer (30), a diode first conductivity type impurity layer (62) is formed on each of said diode second conductivity type impurity layers (63), and said diode first and second conductivity type layers (62, 63) are connected via a wiring layer (64).

* * * * *